United States Patent [19]
Howe et al.

[11] Patent Number: 5,879,963
[45] Date of Patent: Mar. 9, 1999

[54] METHOD OF MAKING A SUB-GROUND PLANE FOR A MICROMACHINED DEVICE

[75] Inventors: Roger T. Howe, Lafayette, Calif.; Richard S. Payne, Andover; Stephen F. Bart, Newton, both of Mass.

[73] Assignee: Analog Devices, Inc., Norwood, Mass.

[21] Appl. No.: 820,248

[22] Filed: Mar. 18, 1997

Related U.S. Application Data

[62] Division of Ser. No. 485,367, Jun. 7, 1995, Pat. No. 5,639,542.

[51] Int. Cl.$^6$ ........................................................ H05K 3/34
[52] U.S. Cl. ............................ 438/52; 438/411; 438/619
[58] Field of Search ................................ 438/50, 52, 421, 438/619, 123, 411, 412

[56] References Cited

U.S. PATENT DOCUMENTS

| | | | |
|---|---|---|---|
| 3,925,880 | 12/1975 | Rosvold | 29/578 |
| 4,918,032 | 4/1990 | Jain et al. | 438/228 |
| 5,326,726 | 7/1994 | Tsang et al. | 437/228 |
| 5,345,824 | 9/1994 | Sherman | 73/517 B |
| 5,479,703 | 1/1996 | Desai | 29/852 |
| 5,537,083 | 7/1996 | Lin | 333/186 |

*Primary Examiner*—Brian Dutton
*Attorney, Agent, or Firm*—Hale and Dorr LLP

[57] ABSTRACT

A method and apparatus for providing a sub-ground plane for a micromachined device. The sub-ground plane is formed in or on the substrate. Above the sub-ground plane is a dielectric and then a discontinuous conductive layer used for interconnects for parts of the micromachined device. A movable microstructure is suspended above the interconnect layer. A conductive layer can be suspended above the movable microstructure. In one embodiment, the sub-ground plane is diffused into the substrate or a well in the substrate, and is of an opposite type from the type of silicon into which it is diffused. Alternatively, the sub-ground plane is formed from a conductive layer, deposited over the substrate before the layer used for interconnects.

14 Claims, 3 Drawing Sheets

METHOD OF MAKING A SUB-GROUND PLANE FOR A MICROMACHINED DEVICE

This application is a division of application Ser. No. 08/485,367, filed Jun. 7, 1995, now U.S. Pat. No. 5,639,542.

FIELD OF THE INVENTION

This invention relates to the field of micromachined devices and, more particularly, to micromachined devices with multiple conductive layers.

BACKGROUND OF THE INVENTION

Micromachined silicon structures are used frequently as sensors and actuators, and for signal processing. For example, the fingers of a movable mass may be positioned between stationary plates to form a differential capacitor. The use of such a device as an accelerometer and a method for fabricating such an accelerometer are described in U.S. Pat. No. 5,345,824, entitled "Monolithic Accelerometer", and U.S. Pat. No. 5,326,726, entitled "Method for Fabricating Monolithic Chip Containing Integrated Circuitry and Suspended Microstructure", which are incorporated herein by reference.

As these micromachined devices become more complex, it becomes desirable to use more conductive layers. Instead of just a single polysilicon layer used for a movable micromachined structure, it is desirable to use an additional polysilicon layer. This additional layer might be above the movable structure, to contain the movable layer or to serve as an electrode for a differential capacitor. This additional layer might be below the movable structure, to provide an extra layer of interconnects with closer spacing than would be possible with diffused regions.

It is also desirable to employ a conductive plane (often referred to as a "ground plane") underneath the movable structure. For example, placing a conductive plane under the structure (the conductive plane being separated from the substrate by a dielectric) and keeping the plane at approximately the same electric potential as the structure minimizes the electrostatic attractive force that would tend to pull the structure down to the substrate.

However, if the bottom polysilicon layer is used to provide an extra layer of interconnects, the gaps in the layer detract from the effectiveness of that layer as a ground plane. The potential of the substrate beneath the gaps is unspecified and the dielectric layer between the substrate and the conductive plane may have charges on it that can cause spurious forces on the microstructure and measurement errors.

The present invention overcomes this and other problems as will be shown in the remainder of the specification referring to the attached drawings.

SUMMARY OF THE INVENTION

The present invention is a micromachined electromechanical structure, and a method for making such a structure, in which a layer of polysilicon is used for an interconnect layer, with an unbroken conductive plane, or sub-ground plane, positioned underneath the interconnect layer and the movable electromechanical structure.

In a preferred embodiment, a conductive plane is formed from an n+ region diffused into a p-silicon substrate or into a p-well of an n-silicon substrate. Alternatively, the conductive plane is formed from a p+ region diffused into an n-silicon substrate or into an n-well of a p-silicon substrate. The conductive plane is tied to a constant voltage, preferably ground.

After application of a dielectric on top of the conductive plane, a first polysilicon layer is deposited and patterned to form an interconnect layer for the components of the micromachined electromechanical device.

A spacer layer is applied over the first polysilicon layer. Then, a second polysilicon layer is deposited. This second polysilicon layer is formed into the microstructure. Parts of the second layer may also be used as jumpers to connect polysilicon or other interconnects.

Additional polysilicon layers may be added above the second layer, if appropriate. Instead of using an n+ or p+ diffused region for the sub-ground plane, an additional polysilicon layer could be deposited before the dielectric and interconnect polysilicon layer, to serve as the sub-ground plane.

DETAILED DESCRIPTION OF A PREFERRED EMBODIMENT

Figure 1:
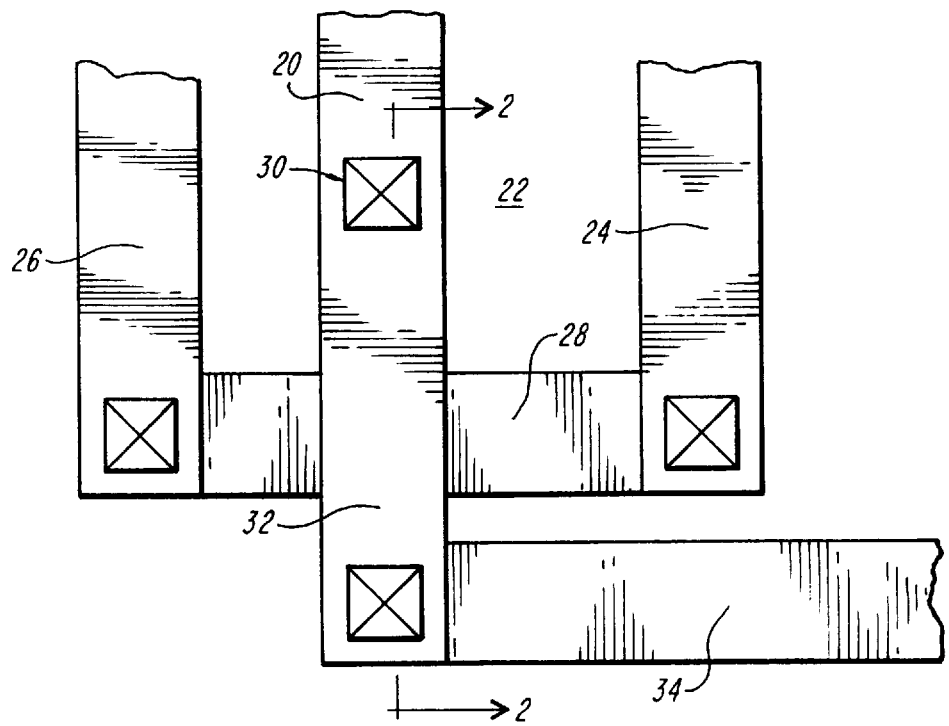
FIG. 1 is a top view of a portion of a microstructure of the present invention.
Figure 2:
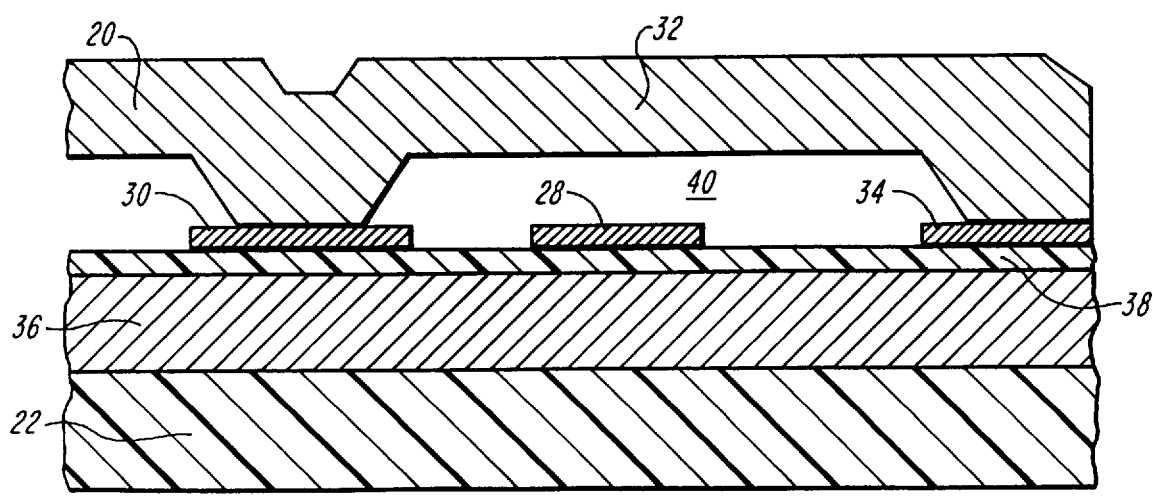
FIG. 2 is a cross-sectional view of a portion of the microstructure of FIG. 1.

With reference to FIGS. 1 and 2, a portion of a micromachined electromechanical structure is shown. Polysilicon finger 20 is suspended above p-type substrate 22 by anchor 30. Polysilicon finger 24 is to one side of finger 20 and polysilicon finger 26 is on the opposite side of finger 20. Fingers 24 and 26 are at the same level as finger 20. Polysilicon jumper 32, also at the same level as finger 20, connects finger 20 to polysilicon interconnect 34, which connects to additional circuitry (not shown). Polysilicon interconnect 28, which is at the same level as interconnect 34 and is below the bottom of finger 20, connects to, and thereby electrically connects, fingers 24 and 26. Jumper 32 passes over interconnect 28. Air gap 40 separates fingers 20, 24, and 26, and jumper 32 from substrate 36.

Interconnects 28 and 34 are part of a first polysilicon layer; fingers 20, 24, and 26, and jumper 32 are part of a second polysilicon layer.

Underneath the micromachined structure, an n+ region is diffused into p-type substrate 22, to form sub-ground plane 36. Sub-ground plane 36 is electrically connected to a die pad (not shown), which is connected to a fixed voltage source, preferably ground. Preferably, sub-ground plane 36 is connected to the die pad via connections from multiple locations along sub-ground plane 36, to minimize any voltage drop across the sub-ground plane. Dielectric 38 separates sub-ground plane 36 from the first polysilicon layer.

Figure 3:
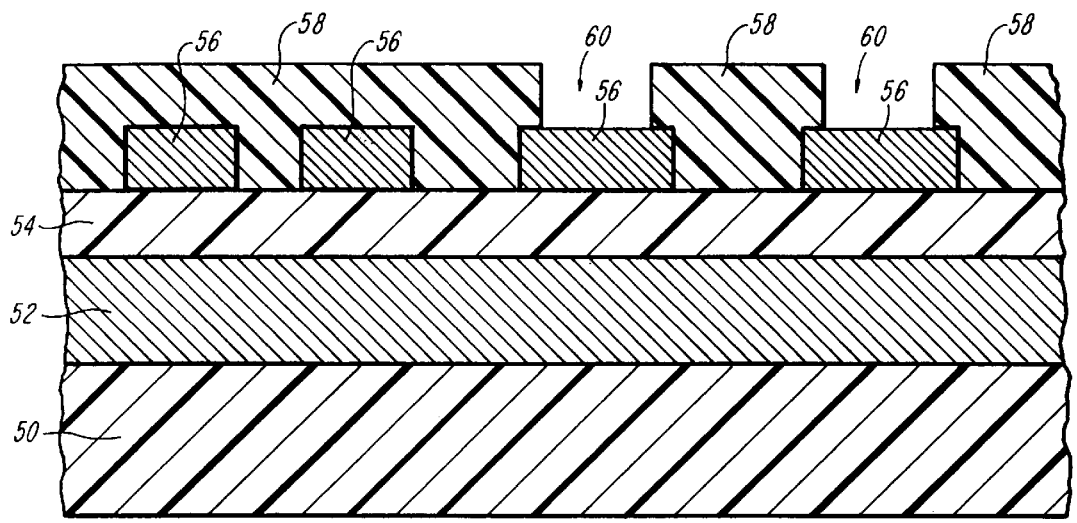
FIG. 3 is a cross-sectional view of a portion of a microstructure of the present invention during fabrication, after the first spacer layer has been deposited and selectively removed.
Figure 4:
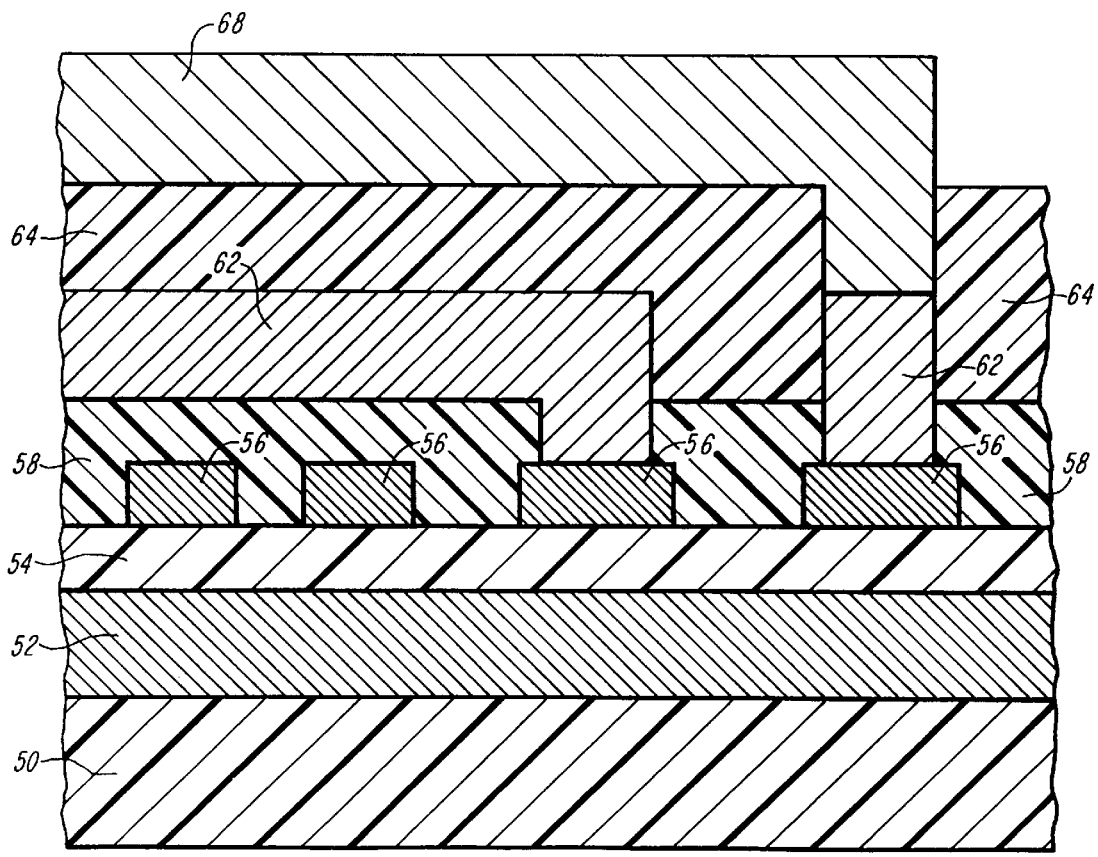
FIG. 4 is a cross-sectional view of a portion of the microstructure of FIG. 3 during a later step in the fabrication, after the third polysilicon layer has been deposited and patterned.
Figure 5:
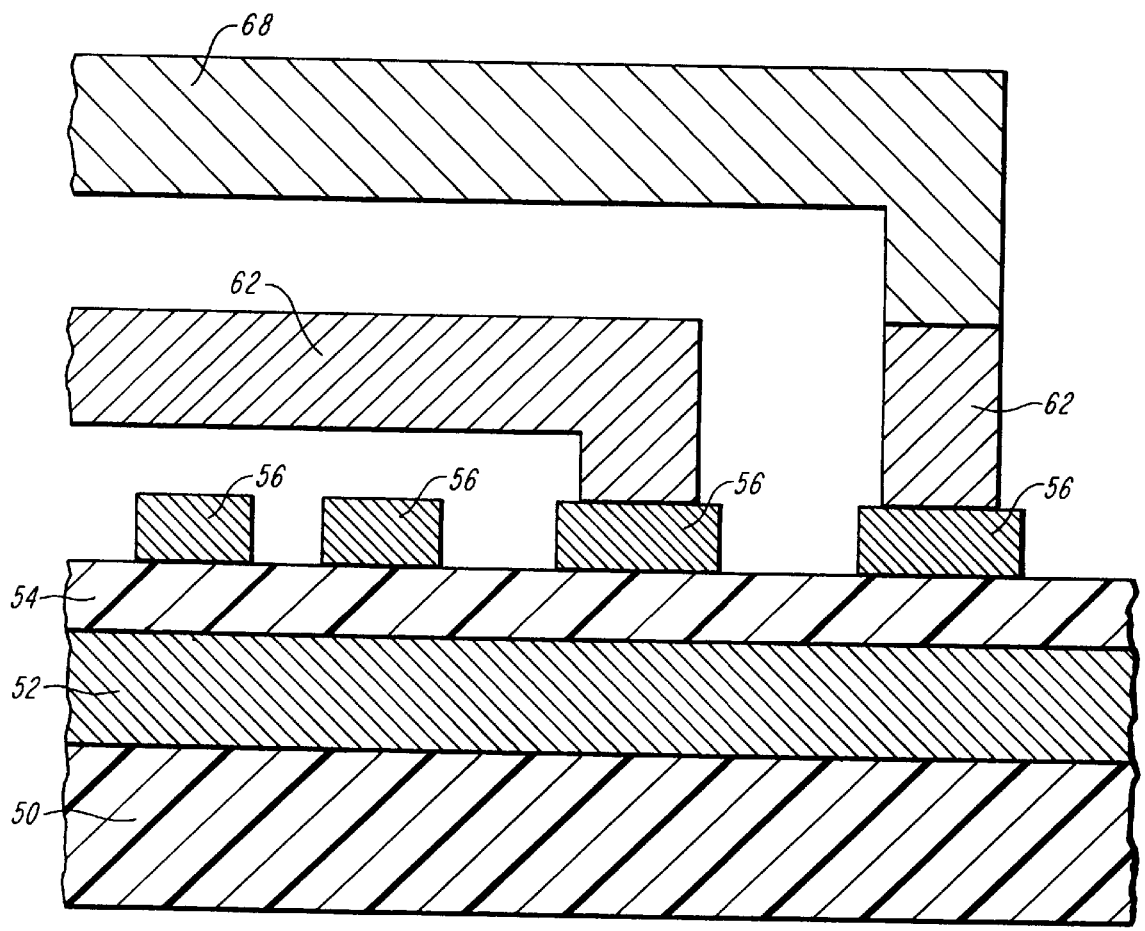
FIG. 5 is a cross-sectional view of a portion of the microstructure of FIGS. 3 and 4 during a later step in the fabrication, after removal of the spacer layers.

A process for manufacturing a microstructure with a sub-ground plane is shown in FIGS. 3–5. Numerous conventional steps in the fabrication process have been omitted as unnecessary to teach those skilled in the art the process of the current invention.

As shown in FIG. 3, n+ region 52 is diffused into p-type substrate 50. Diffused region 52 forms the sub-ground plane, as described above.

Dielectric 54, such as silicon nitride, is deposited over diffused region 52. First polysilicon layer 56 is deposited atop dielectric 54, and patterned to form the interconnect layer. Dielectric 54 prevents electrical connection between the sub-ground plane and the first polysilicon layer. First spacer layer 58, such as silicon oxide, is deposited over first polysilicon layer 56, and removed from selected areas to open anchor regions 60 to first polysilicon layer 56.

As shown in FIG. 4, second polysilicon layer 62 is deposited into anchor regions 60 and atop first spacer layer 58, and patterned to form movable and fixed micromachined structures (such as fingers 20, 24, and 26 in FIG. 1), and interconnect jumpers (such as jumper 32 in FIG. 1).

Second spacer layer 64 is deposited over second polysilicon layer 62 and the exposed portions of the lower levels, and removed from selected areas to open anchor regions 60 to lower polysilicon layers. A third polysilicon layer 68 is then deposited into these new anchor regions and atop second spacer layer 64. Third polysilicon layer 68 is patterned to form stops and capacitor electrodes for the movable structures of second polysilicon layer 62.

Where not necessary, the second spacer layer and third polysilicon layer can be omitted. Preferably, second polysilicon layer 62 is thicker than first polysilicon layer 56 and third polysilicon layer 68.

Finally, as shown in FIG. 5, first and second spacer layers 58 and 64 are removed, freeing the movable structures of second polysilicon layer 62. Diffused n+ region 52 serves as an unbroken ground plane for the entire structure.

Alternatively, by using an additional polysilicon layer, polysilicon can be used as the sub-ground plane. In this embodiment, the first polysilicon layer would be an unbroken layer beneath the micromachined structure, replacing diffused region 52. A second polysilicon layer would be used for interconnects and a third layer for the movable micromachined structures and for jumpers between sections of the second layer of polysilicon. If appropriate, a fourth layer would be used to contain the movable structures and/or to serve as an electrode.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

We claim:

1. A method for fabricating a micromachined structure comprising:

forming a conductive region into a section of a substrate, wherein the conductive region is of a first conductivity type and the section is of a second conductivity type different from the first conductivity type;

providing a dielectric over at least a portion of the conductive region;

forming a first conductive layer over the dielectric;

removing a portion of the first conductive layer, so that the first conductive layer is discontinuous;

forming a spacer layer over the first conductive layer;

forming a second conductive layer over the spacer layer;

forming a microstructure in the second conductive layer; and removing the spacer layer.

2. The method of claim 1, wherein the section of the substrate is a well within the substrate, the well having the second conductivity type and the substrate having the first conductivity type.

3. The method of claim 1, further comprising electrically connecting the conductive region formed in the section of the substrate to a fixed voltage source.

4. The method according to claim 1, further comprising the steps of:

depositing a second spacer layer over the second conductive layer; and depositing a third conductive layer over the second spacer layer.

5. The method of claim 4, wherein the first conductive layer, the second conductive layer, and the third conductive layer include polysilicon.

6. The method of claim 1, wherein the first and second conductive layers are made of polysilicon.

7. A method for fabricating an electromechanical structure comprising:

diffusing a conductive region into a section of a substrate, wherein the conductive region is of an opposite type from a type of the section of the substrate;

covering at least a portion of the conductive region with a dielectric;

depositing a first conductive layer over the dielectric;

removing a portion of the first conductive layer, so that the first conductive layer is discontinuous;

depositing a spacer layer over the first conductive layer;

depositing a second conductive layer over the spacer layer;

forming a microstructure in the second conductive layer; and removing the spacer layer.

8. The method according to claim 7, further comprising electrically connecting the diffused conductive region to a fixed voltage source.

9. The method according to claim 8, wherein the first conductive layer and the second conductive layer include polysilicon.

10. The method according to claim 8, further comprising the steps of:

depositing a second spacer layer over the second conductive layer; and depositing a third conductive layer over the second spacer layer.

11. The method according to claim 10, wherein the first conductive layer, the second conductive layer, and the third conductive layer include polysilicon.

12. The method according to claim 10, wherein the microstructure is movable relative to the substrate.

13. The method according to claim 12, wherein a portion of the third conductive layer is above the microstructure and is not movable relative to the microstructure.

14. The method according to claim 8, wherein the microstructure is movable relative to the substrate.

* * * * *